US011801790B2

(12) United States Patent
Park et al.

(10) Patent No.: US 11,801,790 B2
(45) Date of Patent: Oct. 31, 2023

(54) DISPLAY DEVICE AND REAR-VIEW MIRROR MODULE INCLUDING THE SAME

(71) Applicant: Samsung Display Co., Ltd., Yongin-Si (KR)

(72) Inventors: Byoung-Hee Park, Seoul (KR); Joon-Youp Kim, Seoul (KR); Jeong-Woo Moon, Suwon-si (KR); Jin-Koo Chung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 17/446,826

(22) Filed: Sep. 2, 2021

(65) Prior Publication Data

US 2021/0394678 A1 Dec. 23, 2021

Related U.S. Application Data

(63) Continuation of application No. 16/585,088, filed on Sep. 27, 2019, now Pat. No. 11,135,977, which is a (Continued)

(30) Foreign Application Priority Data

Jun. 14, 2016 (KR) ........................ 10-2016-0073915

(51) Int. Cl.
*G02F 1/157* (2006.01)
*G02F 1/155* (2006.01)
(Continued)

(52) U.S. Cl.
CPC ................ *B60R 1/12* (2013.01); *B60R 1/083* (2013.01); *B60R 1/088* (2013.01); *G02F 1/155* (2013.01);
(Continued)

(58) Field of Classification Search
CPC .......... B60R 1/12; B60R 1/083; B60R 1/088; B60R 2001/1215; B60R 2001/1223;
(Continued)

(56) References Cited

U.S. PATENT DOCUMENTS 7,772,966 B2  8/2010  Turnbull et al.
8,749,725 B2  6/2014  Yoon et al.
(Continued)

FOREIGN PATENT DOCUMENTS

CN     1643444 A    7/2005
CN   101498801 A    8/2009
(Continued)

OTHER PUBLICATIONS

Chinese Office Action Report, Application No. 201710442363.4 dated Sep. 25, 2020, 9 pages.

*Primary Examiner* — Robert E. Tallman
(74) *Attorney, Agent, or Firm* — Innovation Counsel LLP

(57) ABSTRACT

A display device may comprise a transmittance control structure having a variable transmittance and a mirror type display panel disposed on a rear surface of the transmittance control structure. The mirror type display panel may comprise a substrate, a display member disposed on the substrate, the display member including a light emission region, a first transmission region, and a peripheral region surrounding the light emission region and the first transmission region, and a reflective member facing the substrate with respect to the display member, the reflective member including an opening region corresponding to the light emission region, a second transmission region corresponding to the first transmission region, and a reflective region surrounding the opening region and the second transmission region.

10 Claims, 13 Drawing Sheets

Related U.S. Application Data continuation of application No. 15/415,150, filed on Jan. 25, 2017, now Pat. No. 10,449,901.

(51) Int. Cl.

| | | |
|---|---|---|
| *G02F 1/163* | (2006.01) | |
| *B60R 1/12* | (2006.01) | |
| *B60R 1/08* | (2006.01) | |
| *H10K 50/84* | (2023.01) | |
| *H10K 50/856* | (2023.01) | |
| *H10K 59/121* | (2023.01) | |
| *H10K 59/122* | (2023.01) | |
| *H10K 59/12* | (2023.01) | |

(52) U.S. Cl.
CPC .............. *G02F 1/157* (2013.01); *G02F 1/163* (2013.01); *H10K 50/84* (2023.02); *H10K 50/856* (2023.02); *H10K 59/121* (2023.02); *H10K 59/122* (2023.02); *B60R 2001/1215* (2013.01); *B60R 2001/1223* (2013.01); *B60R 2001/1253* (2013.01); *G02F 2201/44* (2013.01); *H10K 59/12* (2023.02)

(58) Field of Classification Search
CPC . B60R 2001/1253; G02F 1/155; G02F 1/157; G02F 1/163; G02F 2201/44; G02F 1/153; H01L 27/3246; H01L 27/326; H01L 51/5237; H01L 51/5271; H01L 27/3244; H01L 27/3248; H01L 27/3262; H01L 51/5246; G09F 9/33; G02B 26/02; G09G 2360/144

See application file for complete search history.

(56) References Cited

U.S. PATENT DOCUMENTS

| | | | |
|---|---|---|---|
| 8,994,010 B2 | 3/2015 | Choi et al. | |
| 9,159,958 B2 | 10/2015 | Jeon et al. | |
| 9,287,339 B2 | 3/2016 | Lee et al. | |
| 9,590,019 B2 | 3/2017 | Kim | |
| 9,647,045 B2 | 5/2017 | Jung et al. | |
| 2008/0297879 A1 | 12/2008 | Tonar et al. | |
| 2009/0096937 A1 | 4/2009 | Bauer et al. | |
| 2009/0190198 A1 | 7/2009 | Kwon | |
| 2012/0074435 A1 | 3/2012 | Ha et al. | |
| 2012/0097928 A1 | 4/2012 | Kim et al. | |
| 2012/0268696 A1 | 10/2012 | Yim et al. | |
| 2013/0147851 A1 | 6/2013 | Yim et al. | |
| 2013/0170013 A1 | 7/2013 | Tonar et al. | |
| 2014/0299850 A1* | 10/2014 | Yim | H01L 33/60 257/40 |
| 2015/0077828 A1* | 3/2015 | Kukita | B60R 1/04 359/266 |

FOREIGN PATENT DOCUMENTS

| | | |
|---|---|---|
| CN | 102290421 A | 12/2011 |
| CN | 102456713 A | 5/2012 |
| CN | 102842271 A | 12/2012 |
| CN | 103165642 A | 6/2013 |
| CN | 103489890 A | 1/2014 |
| CN | 103824528 A | 5/2014 |
| CN | 105093770 A | 11/2015 |
| CN | 105304674 A | 2/2016 |
| CN | 105575997 A | 5/2016 |
| KR | 10-2004-0098051 A | 11/2004 |
| KR | 10-2009-0099744 A | 9/2009 |
| KR | 10-2012-0031365 A | 4/2012 |
| KR | 10-2012-0061106 A | 6/2012 |
| KR | 10-2012-0120705 A | 11/2012 |
| KR | 10-2014-0027755 A | 3/2014 |
| WO | 2012006422 A4 | 1/2012 |

\* cited by examiner

DISPLAY DEVICE AND REAR-VIEW MIRROR MODULE INCLUDING THE SAME

CROSS-REFERENCE TO RELATED APPLICATION(S)

This application is a continuation application of U.S. patent application Ser. No. 16/585,088 filed on Sep. 27, 2019, now U.S. Pat. No. 11,135,977, which is a continuation application of U.S. patent application Ser. No. 15/415,150 filed on Jan. 25, 2017, now U.S. Pat. No. 10,449,901, which claims priority under 35 USC § 119 to Korean Patent Application No. 10-2016-0073915, filed on Jun. 14, 2016 in the Korean Intellectual Property Office (KIPO), the entire disclosures of which are incorporated by reference herein.

BACKGROUND

1. Field

Example embodiments relate to rear-view mirror modules. More particularly, example embodiments relate to display devices and rear-view mirror modules including the display devices to display images.

2. Description of the Related Art

Generally, a mirror (e.g., a side mirror, a rear-view mirror, etc.) may be installed in a vehicle so that a driver may confirm the situations of a left, a right or a rear of the vehicle.

Excessive light may disrupt safe driving when driving at night. When light emitted from a headlight of a rear vehicle is reflected by a rear-view mirror of a front vehicle, the sight of a driver of the front vehicle may be disrupted. Recently, an electrochromic mirror (ECM) technology is utilized to prevent glare when driving at night. Additionally, a display device may be installed on a rear surface of the rear-view mirror so that various information for driving may be provided to the driver.

An illumination sensor may be required to use the electrochromic mirror, and a hole that transmits external light may be required for the rear-view mirror so that the illumination sensor may sense the external light. However, because an extra space may be required to form the hole, an area of the rear-view mirror may be increased, or an area of the display device disposed on the rear surface of the rear-view mirror may be decreased.

SUMMARY

Example embodiments provide display devices for displaying images and reflecting external light, and having a controllable external light reflectance.

Example embodiments provide rear-view mirror modules including a display device and an illumination sensor, and having a controllable external light reflectance.

According to an aspect of example embodiments, a display device may comprise a transmittance control structure having a variable transmittance, and a mirror type display panel disposed on a bottom surface of the transmittance control structure. The mirror type display panel may comprise a substrate, a display member disposed on the substrate, the display member including a light emission region, a first transmission region, and a peripheral region surrounding the light emission region and the first transmission region, and a reflective member facing the substrate with respect to the display member, the reflective member including an opening region corresponding to the light emission region, a second transmission region corresponding to the first transmission region, and a reflective region surrounding the opening region and the second transmission region.

In example embodiments, the display member may comprise a switching structure disposed on the substrate in the light emission region, an insulation structure disposed on the substrate, the insulation structure covering the switching structure, and an organic light emitting structure disposed on the insulation structure.

In example embodiments, the organic light emitting structure may comprise a first electrode disposed on the insulation structure in the light emission region, a second electrode facing the first electrode, and an organic light emitting layer disposed between the first electrode and the second electrode. The display member may further comprise a pixel defining layer disposed on the insulation structure, the pixel defining layer partially covering the first electrode and defining the light emission region.

In example embodiments, the second electrode may be selectively disposed in the light emission region and the peripheral region. A transmission window may be defined by a sidewall of the second electrode and a top surface of the pixel defining layer.

In example embodiments, the second electrode and the pixel defining layer may be selectively disposed in the light emission region and the peripheral region. A transmission window may be defined by a sidewall of the second electrode, a sidewall of the pixel defining layer, and a top surface of the insulation structure.

In example embodiments, the second electrode, the pixel defining layer, and the insulation structure may be selectively disposed in the light emission region and the peripheral region. A transmission window may be defined by a sidewall of the second electrode, a sidewall of the pixel defining layer, a sidewall of the insulation structure, and a top surface of the substrate.

In example embodiments, the switching structure may comprise an active pattern, a gate electrode, a source electrode, and a drain electrode layered on the substrate. The insulation structure may comprise a gate insulation layer disposed on the substrate, the gate insulation layer covering the active pattern, an insulation interlayer disposed on the gate insulation layer, the insulation interlayer covering the gate electrode, and a protective layer disposed on the insulation interlayer, the protective layer covering the source electrode and the drain electrode. The source electrode and the drain electrode may contact the active pattern through the insulation interlayer and the gate insulation layer. The first electrode may be disposed on the protective layer, and may contact the drain electrode through the protective layer.

In example embodiments, the second electrode, the pixel defining layer, and the protective layer may be selectively disposed in the light emission region and the peripheral region. A transmission window may be defined by a sidewall of the second electrode, a sidewall of the pixel defining layer, a sidewall of the protective layer, and a top surface of the insulation interlayer.

In example embodiments, the reflective member may include at least one selected from silver (Ag), aluminum (Ag), nickel (Ni), chromium (Cr), tungsten (W), vanadium (V), and molybdenum (Mo).

In example embodiments, the mirror type display panel may further comprise an encapsulation member facing the substrate with respect to the display member. The reflective member may be disposed on one surface or an inside of the encapsulation member.

According to an aspect of example embodiments, a rear-view mirror module may comprise a transmittance control structure having a variable transmittance and including an opening portion, a mirror type display panel disposed on a bottom surface of the transmittance control structure, and an illumination sensor disposed on a bottom surface of the mirror type display panel. The mirror type display panel may comprise a substrate, a display member disposed on the substrate, the display member including a light emission region, a first transmission region, and a peripheral region surrounding the light emission region and the first transmission region, and a reflective member facing the substrate with respect to the display member, the reflective member including an opening region corresponding to the light emission region, a second transmission region corresponding to the first transmission region, and a reflective region surrounding the opening region and the second transmission region. The opening portion, the first transmission region, and the second transmission region may correspond to the illumination sensor.

In example embodiments, the transmittance control structure may include an electrochromic material.

In example embodiments, the transmittance control structure may comprise a first transparent substrate and a second transparent substrate which face each other, a first transparent electrode and a second transparent electrode disposed on facing surfaces of the first transparent substrate and the second transparent substrate, respectively, and an electrochromic layer interposed between the first transparent electrode and the second transparent electrode.

In example embodiments, the transmittance control structure may have a higher light transmittance when an electrical signal is not applied and a lower light transmittance when the electrical signal is applied.

In example embodiments, the mirror type display panel may substantially overlap the transmittance control structure.

In example embodiments, an external light incident onto a front surface of the transmittance control structure may be transferred to the illumination sensor through the opening portion, the second transmission region, and the first transmission region.

In example embodiments, the rear-view mirror module may further comprise a luminance controller controlling a luminance of the mirror type display panel, and a transmittance controller controlling a transmittance of the transmittance control structure.

In example embodiments, the luminance controller and the transmittance controller may control the luminance of the mirror type display panel and the transmittance of the transmittance control structure, respectively, based on an intensity of the external light incident into the illumination sensor.

In example embodiments, the luminance controller may decrease the luminance of the mirror type display panel and the transmittance controller may increase the transmittance of the transmittance control structure when the intensity of the external light is less than a predetermined intensity.

In example embodiments, the luminance controller may increase the luminance of the mirror type display panel and the transmittance controller may decrease the transmittance of the transmittance control structure when the intensity of the external light is greater than a predetermined intensity.

According to example embodiments of the present invention, the display device may include the mirror type display panel including the light emission region for emitting light, the reflective region for reflecting the external light, and the transmission region for transmitting the external light, and the transmittance control structure having a variable transmittance, thereby reflecting the external light as well as displaying images, and controlling the reflectance of the external light.

According to example embodiments of the present invention, the rear-view mirror module may include the display device and the illumination sensor, and the light transmission region corresponding to the illumination sensor may be formed in the display device, so that the external light may be transferred to the illumination sensor through the light transmission region. Therefore, the light transmittance of the transmittance control structure may be controlled, the reflectance of the external light may be controlled, and the area of the display device may be increased.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, display devices and rear-view mirror modules including the display devices in accordance with example embodiments will be explained in detail with reference to the accompanying drawings.

Figure 1A:
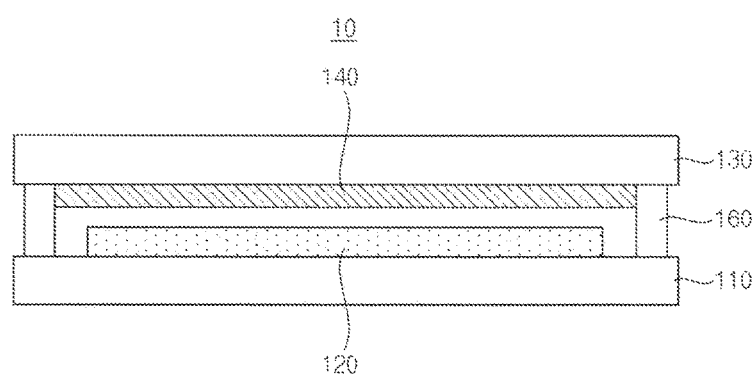
FIGS. 1A and 1B are cross-sectional views illustrating mirror type display panels in accordance with example embodiments.
Figure 1B:
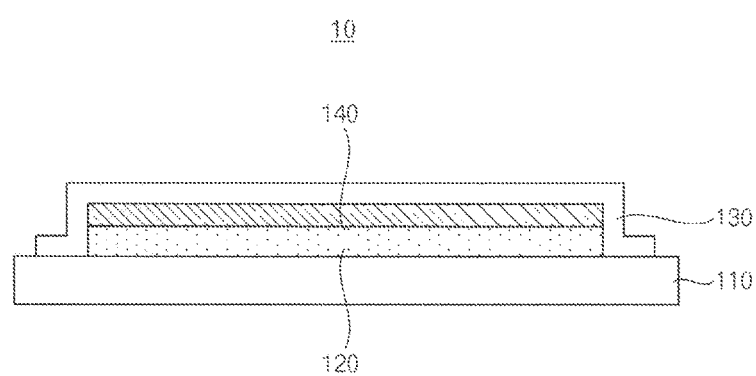

FIGS. 1A and 1B are cross-sectional views illustrating mirror type display panels in accordance with example embodiments.

Figure 10:
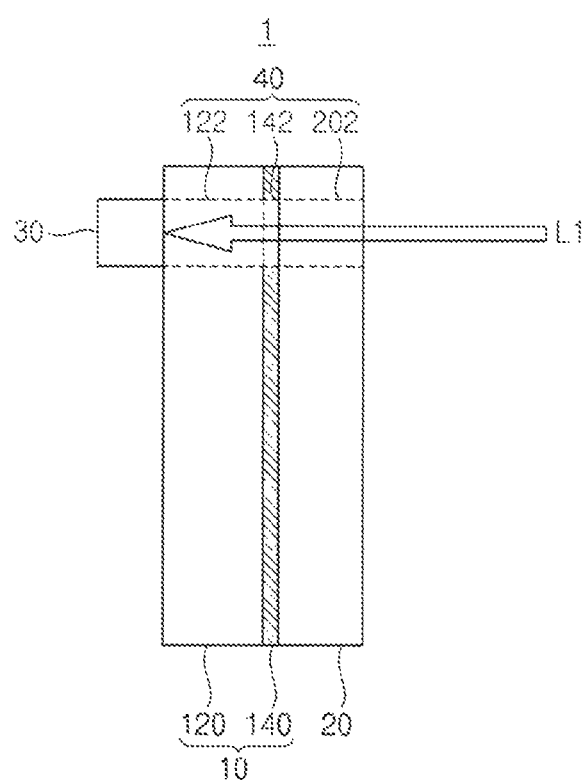
FIG. 10 is a cross-sectional view illustrating the rear-view mirror module in FIG. 9.

Referring to FIG. 1A, a display device in accordance with example embodiments may include a transmittance control structure 20 in FIG. 10 having a variable transmittance and a mirror type display panel 10 disposed on a rear surface of the transmittance control structure 20. The mirror type display panel 10 may include a substrate 110, a display member 120 disposed on the substrate 110, an encapsulation member 130 facing the substrate 110 with respect to the display member 120, and a reflective member 140 provided on the encapsulation member 130.

The substrate 110 and the encapsulation member 130 may encapsulate the display member 120 to protect the display member 120 from external oxygen or moisture. The substrate 110 and the encapsulation member 130 may be attached to each other by the sealant 160. A moisture absorbent material and/or a filler may be disposed in a space between the substrate 110 and the encapsulation member 130 formed by the sealant 160. For example, the substrate 110 may be a transparent glass or plastic substrate, and the encapsulation member 130 may include transparent glass or plastic similar to the substrate 110.

The encapsulation member 130 of FIG. 1A may be a transparent glass substrate or a plastic substrate; however, the present invention is not limited thereto. The encapsulation member 130 may have a structure in which at least one inorganic layer and at least one organic layer are alternatively layered, such as illustrated in FIG. 1B. In this case, the encapsulation member 130 may be disposed on the display member 120, and the substrate 110 and the encapsulation member 130 may be directly attached.

In example embodiments, the reflective member 140 may be disposed on one of both surfaces of the encapsulation member 130. For example, as illustrated in FIG. 1A, the reflective member 140 may be disposed on a first surface of the encapsulation member 130 that faces the substrate 110. However, the present invention is not limited thereto. The reflective member 140 may be disposed on a second surface opposite to the first surface of the encapsulation member 130. In some example embodiments, when the encapsulation member 130 has a structure in which at least one inorganic layer and at least one organic layer are alternatively layered as illustrated in FIG. 1B, the reflective member 140 may be disposed inside the encapsulation member 130. For example, the reflective member 140 may be disposed on a first encapsulation member in which at least one inorganic layer and at least one organic layer are alternatively layered, and a second encapsulation member in which at least one inorganic layer and at least one organic layer are alternatively layered may be disposed on the reflective member 140. In other words, the reflective member 140 may be interposed between the first encapsulation member and the second encapsulation member.

Figure 2:
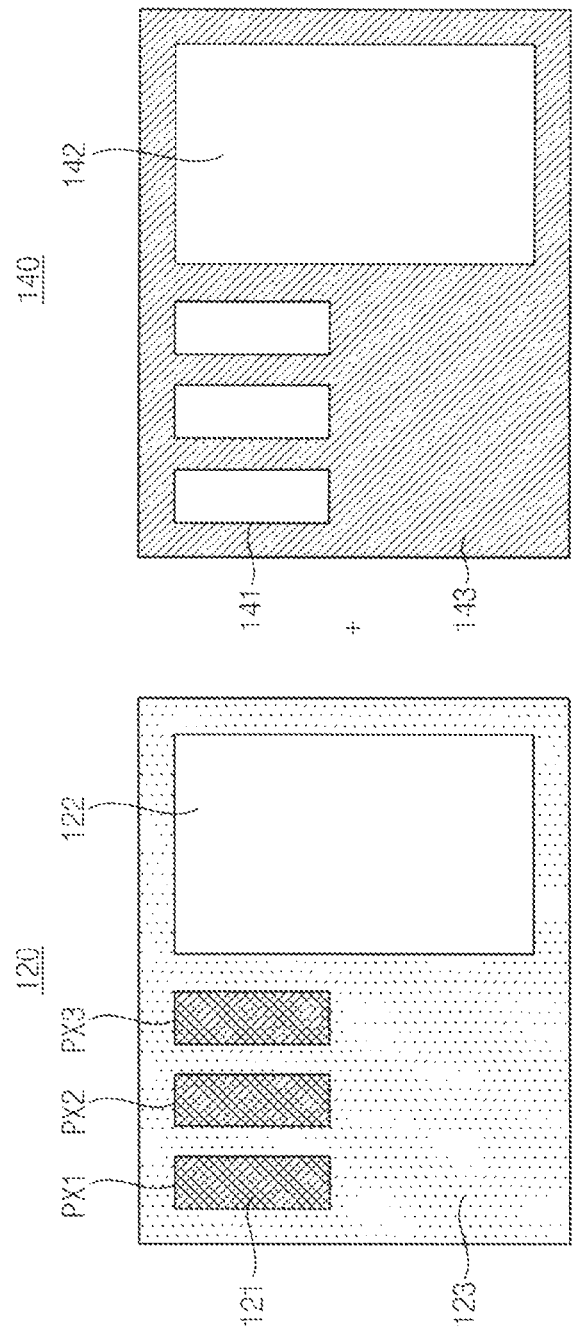
FIG. 2 is a plan view illustrating a portion of the mirror type display panel in FIG. 1A.

FIG. 2 is a plan view illustrating a portion of the mirror type display panel in FIG. 1A.

Referring to FIG. 2, the display member 120 may include a light emission region 121, a first transmission region 122, and a peripheral region 123 surrounding the light emission region 121 and the first transmission region 122. The light emission region 121 may include a plurality of pixels PX1, PX2 and PX3 each emitting light of a particular color (e.g., red, green or blue). An image may be displayed in the light emission region 121, and the light emission region 121 may have various shapes. The first transmission region 122 may transmit external light incident onto a front surface of the mirror type display panel 10.

The reflective member 140 may include a first opening region 141 corresponding to the light emission region 121, a second transmission region 142 corresponding to the first transmission region 122, and a reflective region 143 surrounding the first opening region 141 and the second transmission region 142. The first opening region 141 may correspond to the light emission region 121 so that light emitted from the light emission region 121 may be emitted to the front surface of the mirror type display panel 10 through the first opening region 141. The reflective region 143 may reflect the external light incident onto the front surface of the mirror type display panel 10 so that the mirror type display panel 10 may perform a mirror function. The second transmission region 142 may transmit therethrough the external light incident onto the front surface of the mirror type display panel 10.

Figure 3:
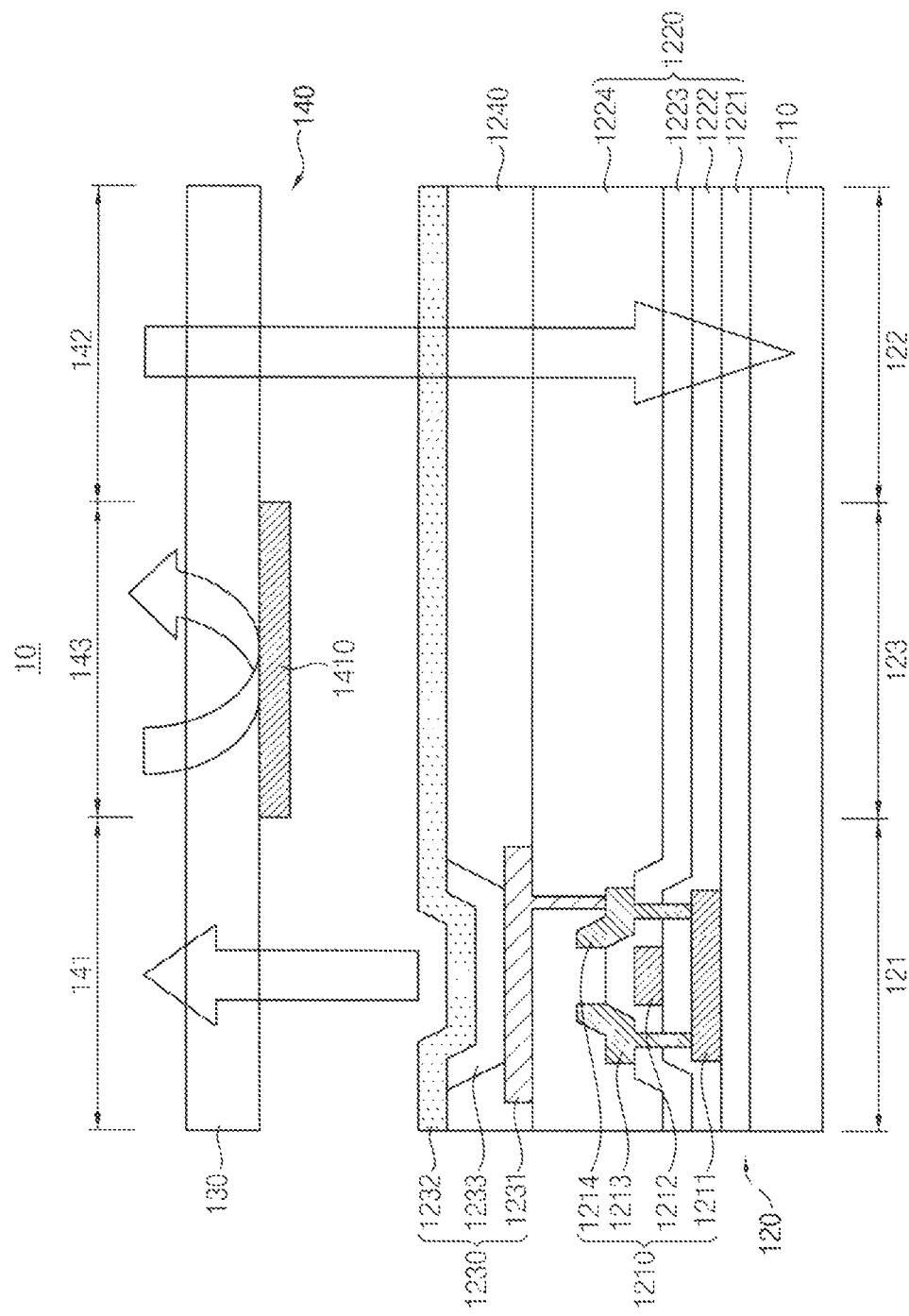
FIG. 3 is a cross-sectional view illustrating a mirror type display panel in accordance with example embodiments.

FIG. 3 is a cross-sectional view illustrating a mirror type display panel in accordance with example embodiments.

Referring to FIG. 3, the display member 120 may include a switching structure 1210 disposed on the substrate 110 in the light emission region 121, an insulation structure 1220 disposed on the substrate 110 to cover the switching structure 1210, and an organic light emitting structure 1230 disposed on the insulation structure 1220.

The switching structure 1210 may transmit a driving current for driving the organic light emitting structure 1230 in response to an electrical signal. The organic light emitting structure 1230 may emit light in response to the driving current transferred from the switching structure 1210.

The switching structure 1210 may include an active pattern 1211, a gate electrode 1212, a source electrode 1213 and a drain electrode 1214, which are layered on the substrate 110. The insulation structure 1220 may include a buffer layer 1221, a gate insulation layer 1222, an insulation interlayer 1223 and a protective layer 1224, which are layered on the substrate 110.

The buffer layer 1221 may be disposed on the substrate 110. The buffer layer 1221 may block moisture permeating through the substrate 110, and may block a diffusion of impurities between the substrate 110 and structures thereon. For example, the buffer layer 1221 may include silicon oxide, silicon nitride, and/or silicon oxynitride. In example embodiments, the buffer layer 1221 may be commonly provided in the light emission region 121, the first transmission region 122 and the peripheral region 123. In some example embodiments, the buffer layer 1221 may be selectively provided in the light emission region 121 and the peripheral region 123.

The active pattern 1211 may be disposed on the buffer layer 1221 in the light emission region 121. A source region and a drain region, which include p-type or n-type impurities, may be disposed on opposite sides of the active pattern 1211. In example embodiments, the active pattern 1211 may include a silicon compound such as a polysilicon. In some example embodiments, the active pattern 1211 may include an oxide semiconductor such as indium-gallium-zinc oxide (IGZO), zinc-tin oxide (ZTO), or indium-tin-zinc oxide (ITZO).

The gate insulation layer 1222 may be disposed on the buffer layer 1221 to cover the active pattern 1211. The gate insulation layer 1222 may include silicon oxide, silicon nitride, and/or silicon oxynitride. In example embodiments, the gate insulation layer 1222 may be commonly provided in the light emission region 121, the first transmission region 122 and the peripheral region 123. In some example embodiments, the gate insulation layer 1222 may be selectively provided in the light emission region 121 and the peripheral region 123.

The gate electrode 1212 may be disposed on the gate insulation layer 1222. The gate electrode 1212 may substantially overlap a portion of the active pattern 1211 with respect to the gate insulation layer 1222. The gate electrode 1212 may include metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), scandium (Sc), an alloy thereof, a nitride thereof, etc.

The insulation interlayer 1223 may be disposed on the gate insulation layer 1222 to cover the gate electrode 1212. The insulation interlayer 1223 may include silicon oxide, silicon nitride, and/or silicon oxynitride. In example embodiments, the insulation interlayer 1223 may be commonly provided in the light emission region 121, the first transmission region 122 and the peripheral region 123. In some example embodiments, the insulation interlayer 1223 may be selectively provided in the light emission region 121 and the peripheral region 123.

The source electrode 1213 and the drain electrode 1214 may be disposed on the insulation interlayer 1223. Each of the source electrode 1213 and the drain electrode 1214 may pass through the insulation interlayer 1223 and the gate insulation layer 1222 to contact the active pattern 1211. Each of the source electrode 1213 and the drain electrode 1214 may include metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), scandium (Sc), an alloy thereof, a nitride thereof, etc.

The source electrode 1213 and the drain electrode 1214 may be in contact with the source region and the drain region of the active pattern 1211, respectively. A portion of the active pattern 1211 between the source region and the drain region may serve as a channel through which charges are transferred.

FIG. 3 illustrates a top gate structure in which the gate electrode 1212 is disposed over the active pattern 1211; however, the switching structure 1210 may have a bottom gate structure in which the gate electrode 1212 is disposed under the active pattern 1211.

The protective layer 1224 may be disposed on the insulation interlayer 1223 to cover the source electrode 1213 and the drain electrode 1214. The protective layer 1224 may accommodate a via structure electrically connecting a first electrode 1231 and the drain electrode 1214. Additionally, the protective layer 1224 may serve as a planarization layer for structures thereon. The protective layer 1224 may include organic material such as polyimide, epoxy-based resin, acryl based resin, polyester, etc. In example embodiments, the protective layer 1224 may be commonly provided in the light emission region 121, the first transmission region 122 and the peripheral region 123. In some example embodiments, the protective layer 1224 may be selectively provided in the light emission region 121 and the peripheral region 123.

The organic light emitting structure 1230 may include the first electrode 1231 disposed on the protective layer 1224 in the light emission region 121, a second electrode 1232 facing the first electrode 1231, and an organic light emitting layer 1233 disposed between the first electrode 1231 and the second electrode 1232.

The first electrode 1231 may be disposed on the protective layer 1224, and may include the via structure electrically connected or contacted to the drain electrode 1214 through the protective layer 1224. The first electrode 1231 may be disposed as an individual island shape per one pixel. The first electrode 1231 may be provided as a pixel electrode or an anode of the organic light emitting structure 1230.

In example embodiments, the first electrode 1231 may be a reflective electrode including a reflective layer. For example, the reflective layer include metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), scandium (Sc), etc. In some example embodiments, a transparent layer or a transflective layer including indium-tin oxide (ITO), indium-zinc oxide (IZO), zinc oxide (ZnO), indium-gallium oxide (IGO), etc. may be further disposed on the reflective layer.

A pixel defining layer 1240 may be disposed on the protective layer 1224 to partially cover the first electrode 1231. The pixel defining layer 1240 may cover a peripheral portion of the first electrode 1231 and may expose a center portion of the first electrode 1231, thereby defining the light emitting region 121 of the display member 120. The pixel defining layer 1240 may include organic material such as polyimide, epoxy-based resin, acryl based resin, polyester, etc. In example embodiments, the pixel defining layer 1240 may be commonly provided in the light emission region 121, the first transmission region 122 and the peripheral region 123. In some example embodiments, the pixel defining layer 1240 may be selectively provided in the light emission region 121 and the peripheral region 123.

The second electrode 1232 may be disposed over the first electrode 1231 to face the first electrode 1231. The second electrode 1232 may be commonly provided to the plurality of pixels. The second electrode 1232 may serve as a common electrode or a cathode of the organic light emitting structure 1230.

In example embodiments, the second electrode 1232 may be a transparent electrode including a transparent layer. For example, the second electrode 1232 may include metal such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), scandium (Sc), etc. or indium-tin oxide (ITO), indium-zinc oxide (IZO), zinc oxide (ZnO), indium-gallium oxide (IGO), etc. Here, the second electrode 1232 may be formed thinner than the first electrode 1231 to increase light transmittance of the second electrode 1232.

The organic light emitting layer 1233 may be disposed between the first electrode 1231 and the second electrode 1232. The organic light emitting layer 1233 may include a host material excited by holes and electrons, and a dopant material increasing an emission efficiency by absorption and emission of energy. In example embodiments, the organic light emitting layer 1233 may be patterned per one pixel.

In example embodiments, a hole transport layer (HTL) may be further disposed between the first electrode 1231 and the organic light emitting layer 1233, and an electron transport layer (ETL) may be further disposed between the organic light emitting layer 1233 and the second electrode 1232. The HTL and the ETL may be commonly provided for the plurality of pixels.

The reflective member 140 may include a reflective layer 1410. The reflective layer 1410 may be disposed on the encapsulation member 130. The reflective layer 1410 may reflect external light incident onto the front surface of the encapsulation member 130. In example embodiments, the reflective layer 1410 may be disposed on a surface facing the substrate 110 of both surfaces of the encapsulation member 130. The reflective layer 1410 may include silver (Ag), aluminum (Al), nickel (Ni), chromium (Cr), tungsten (W), vanadium (V) and/or molybdenum (Mo).

The reflective layer 1410 may be substantially selectively disposed in the reflective region 143. Therefore, light emitted from the organic light emitting layer 1233 of the organic light emitting structure 1230 may pass through the first opening region 141, and the external light incident onto the front surface of the encapsulation member 130 may pass through the second transmission region 142.

FIGS. 4 to 7 are cross-sectional views illustrating a mirror type display panel in accordance with some example embodiments.

The mirror type display panel 10 illustrated in FIGS. 4 to 7 may have elements and/or constructions substantially the same as or similar to the mirror type display panel 10 illustrated in FIG. 3 except for constructions of the second electrode 1232, the pixel defining layer 1240, or the insulation interlayer 1220 in the first transmission region 122. Therefore, detailed descriptions on the repeated elements and/or constructions are omitted, and like reference numerals are used to designate like elements.

Figure 4:
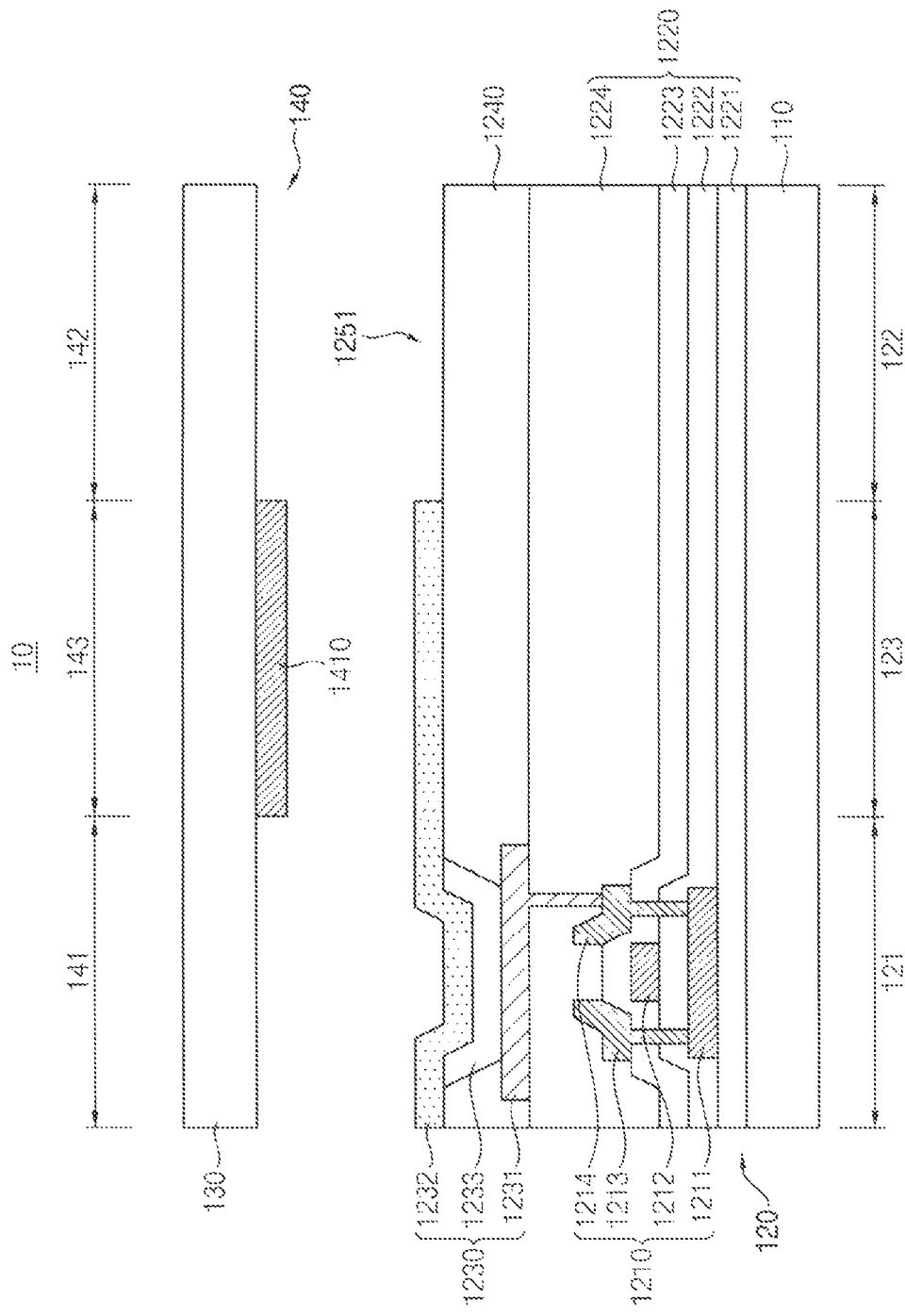
FIGS. 4, 5, 6 and 7 are cross-sectional views illustrating a mirror type display panel in accordance with some example embodiments.

Referring to FIG. 4, the second electrode 1232 may be substantially selectively disposed in the light emission region 121 and the peripheral region 123, and a top surface of the pixel defining layer 1240 may be exposed in the first transmission region 122. A transmission window 1251 may be defined by a sidewall of the second electrode 1232 and the top surface of the pixel defining layer 1240 in the first transmission region 122. Therefore, light transmittance in the first transmission region 122 may be improved.

Figure 5:
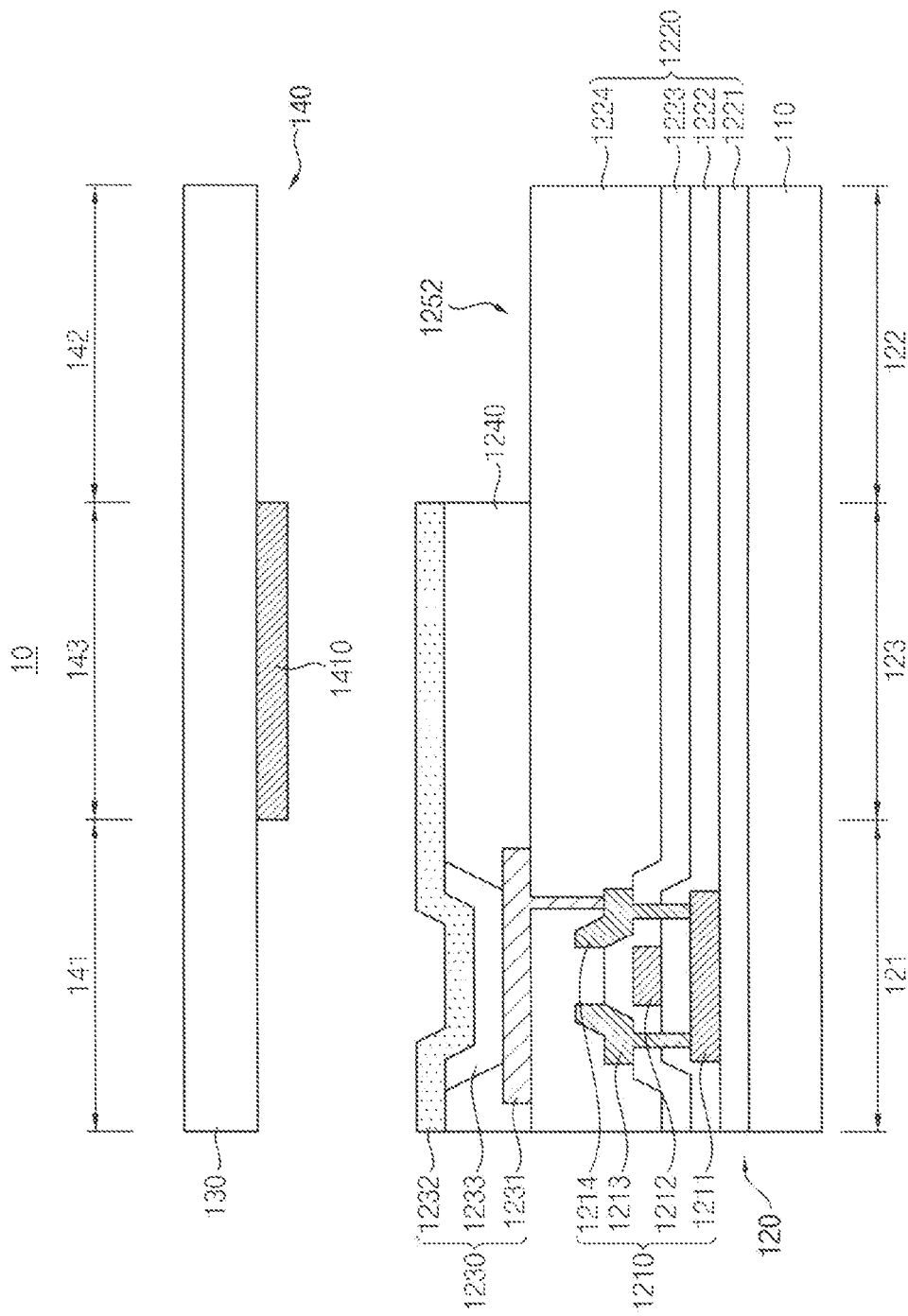

Referring to FIG. 5, the second electrode 1232 and the pixel defining layer 1240 may be substantially selectively disposed in the light emission region 121 and the peripheral region 123, and a top surface of the protective layer 1224 may be exposed in the first transmission region 122. A transmission window 1252 may be defined by a sidewall of the second electrode 1232, a sidewall of the pixel defining layer 1240, and the top surface of the protective layer 1224 in the first transmission region 122. Therefore, light transmittance in the first transmission region 122 may be further improved.

Figure 6:
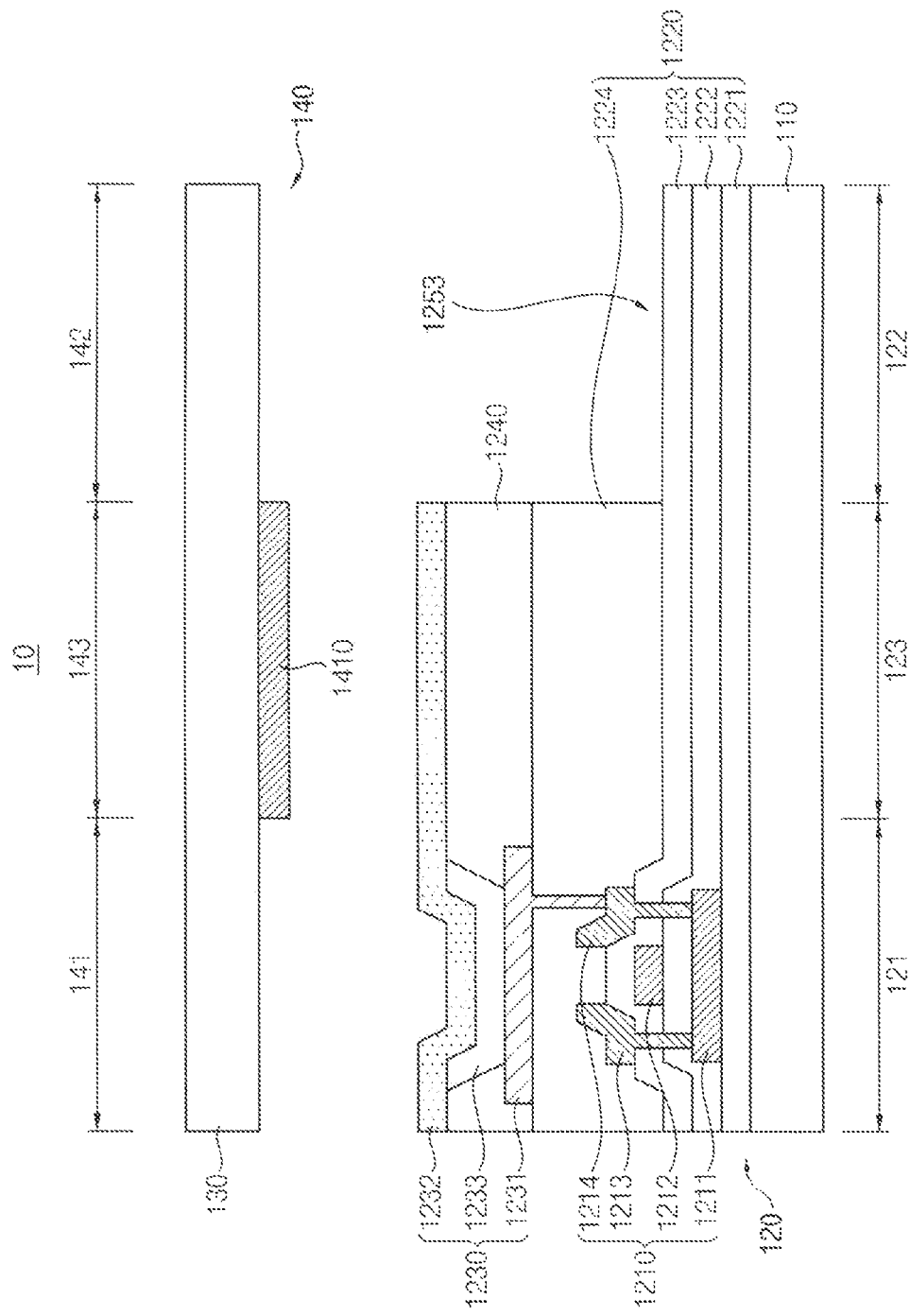
Figure 7:
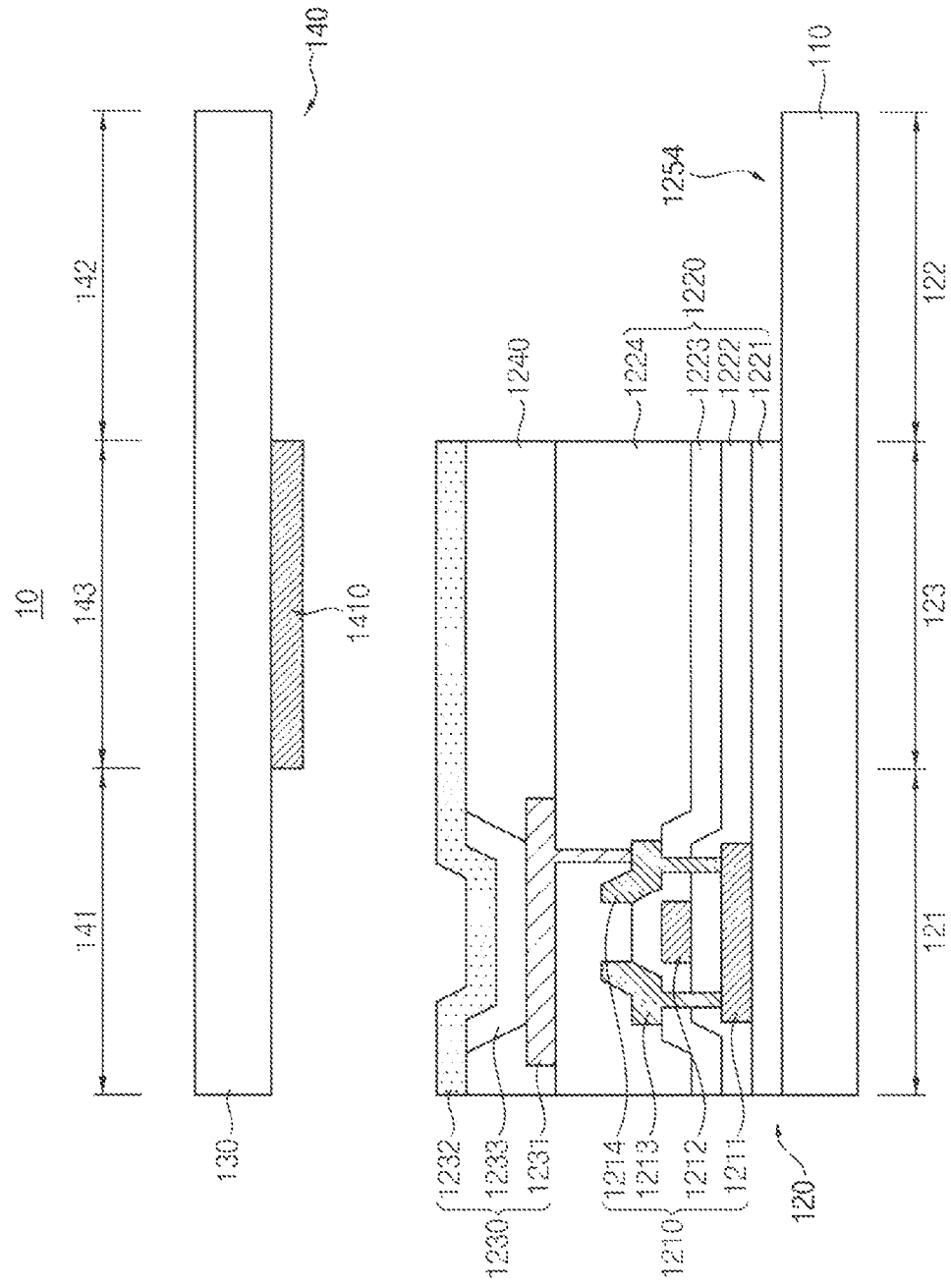

Referring to FIGS. 6 and 7, the second electrode 1232, the pixel defining layer 1240, and at least a portion of the insulation structure 1220 may be substantially selectively disposed in the light emission region 121 and the peripheral region 123.

In example embodiments, as illustrated in FIG. 6, the second electrode 1232, the pixel defining layer 1240, and the protective layer 1224 may be substantially selectively disposed in the light emission region 121 and the peripheral region 123, and a top surface of the insulation interlayer 1223 may be exposed in the first transmission region 122. Here, a transmission window 1253 may be defined by a sidewall of the second electrode 1232, a sidewall of the pixel defining layer 1240, a sidewall of the protective layer 1224, and the top surface of the insulation interlayer 1223 in the first transmission region 122.

In some example embodiments, as illustrated in FIG. 7, the second electrode 1232, the pixel defining layer 1240, the protective layer 1224, the insulation interlayer 1223, the gate insulation layer 1222, and the buffer layer 1221 may be substantially selectively disposed in the light emission region 121 and the peripheral region 123, and a top surface of the substrate 110 may be exposed in the first transmission region 122. Here, a transmission window 1254 may be defined by a sidewall of the second electrode 1232, a sidewall of the pixel defining layer 1240, a sidewall of the protective layer 1224, a sidewall of the insulation interlayer 1223, a sidewall of the gate insulation layer 1222, a sidewall of the buffer layer 1221, and the top surface of the substrate 110 in the first transmission region 122. Therefore, light transmittance in the first transmission region 122 may be even further improved.

Figure 8:
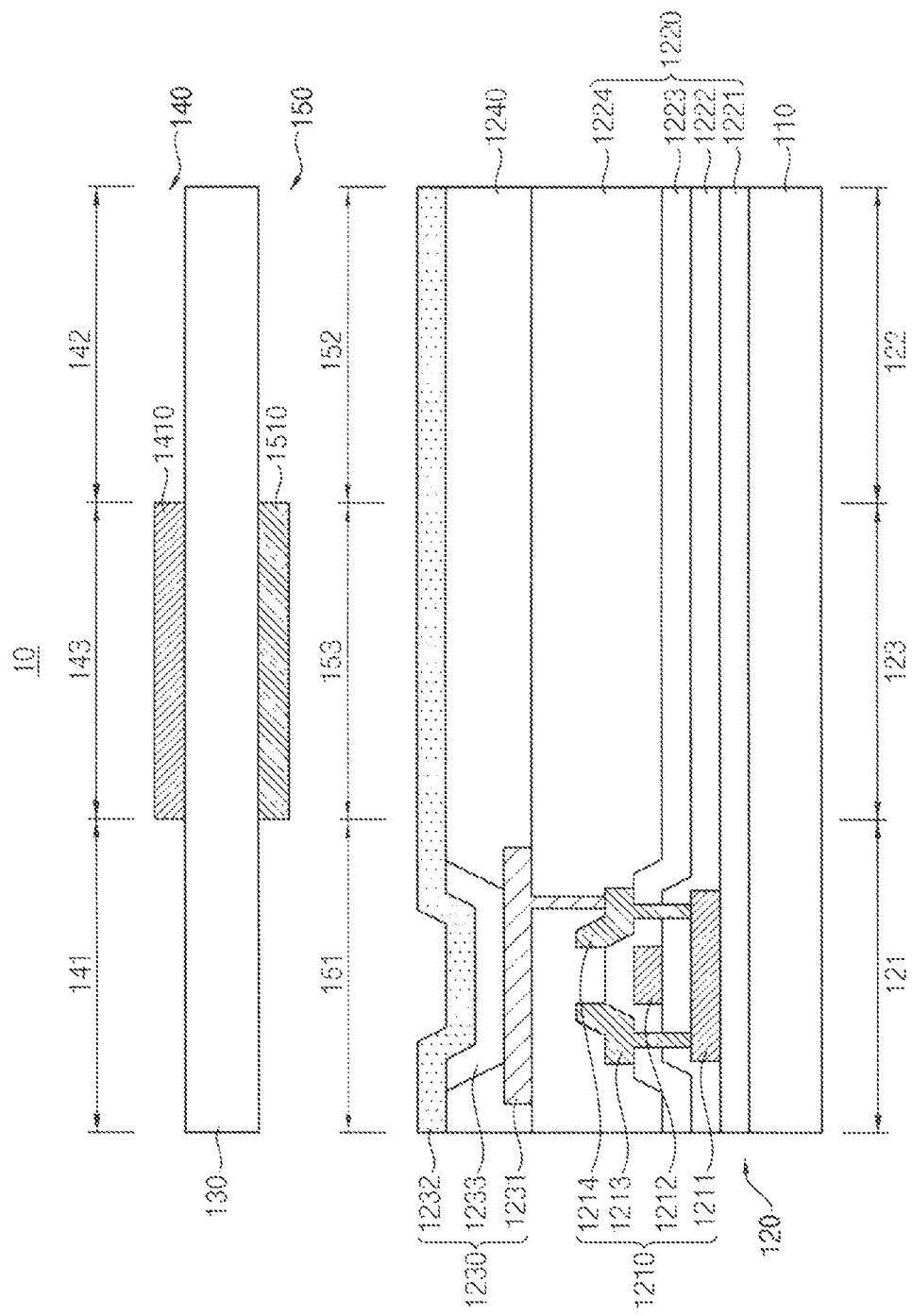
FIG. 8 is a cross-sectional view illustrating a mirror type display panel in accordance with some example embodiments.

FIG. 8 is a cross-sectional view illustrating a mirror type display panel in accordance with some example embodiments.

The mirror type display panel 10 illustrated in FIG. 8 may have elements and/or constructions substantially the same as or similar to the mirror type display panel 10 illustrated in FIG. 3 except for constructions of the reflective member 140 and an addition of a light absorption member 150. Therefore, detailed descriptions on the repeated elements and/or constructions are omitted, and like reference numerals are used to designate like elements.

Referring to FIG. 8, the mirror type display panel 10 may include a reflective member 140 and a light absorption member 150 which are disposed on the encapsulation member 130. The reflective member 140 may include a first opening region 141 corresponding to the light emission region 121, a second transmission region 142 corresponding to the first transmission region 122, and a reflective region 143 surrounding the first opening region 141 and the second transmission region 142. The light absorption member 150 may include a second opening region 151 corresponding to the light emission region 121, a third transmission region 152 corresponding to the first transmission region 122, and a light absorption region 153 surrounding the second opening region 151 and the third transmission region 152.

The reflective member 140 may include a reflective layer 1410. The reflective layer 1410 may be disposed on the encapsulation member 130. The reflective layer 1410 may reflect external light incident onto the front surface of the encapsulation member 130. In example embodiments, the reflective layer 1410 may be disposed on one surface opposite to the other surface facing the substrate 110 of the encapsulation member 130. The reflective layer 1410 may include silver (Ag), aluminum (Al), nickel (Ni), chromium (Cr), tungsten (W), vanadium (V) and/or molybdenum (Mo).

The reflective layer 1410 may be substantially selectively disposed in the reflective region 143. Therefore, light emitted from the organic light emitting layer 1233 of the organic light emitting structure 1230 may pass through the first opening region 141, and the external light incident onto the front surface of the encapsulation member 130 may pass through the second transmission region 142.

The light absorption member 150 may include a light absorption layer 1510. The light absorption layer 1510 may be disposed on the encapsulation member 130 in the light absorption region 153. When the external light that is incident onto the front surface of the encapsulation member 130 passes through the second opening region 151 and the third transmission region 152, it may be diffusely reflected by electrodes and wirings included in the display member 120, thereby degrading mirror quality of the mirror type display panel 10. To prevent the degradation of mirror quality of the mirror type display panel 10, the light absorption layer 1510 may be disposed on the encapsulation member 130 to absorb the diffusely reflected external light. In example embodiments, the light absorption layer 1510 may be disposed on a surface of the encapsulation member 130 that is facing the substrate 110.

The light absorption layer 1510 may be substantially selectively disposed in the light absorption region 153. Therefore, light emitted from the organic light emitting layer 1233 of the organic light emitting structure 1230 may pass through the second opening region 151, and the external light incident onto the front surface of the encapsulation member 130 may pass through the third transmission region 152.

Figure 9:
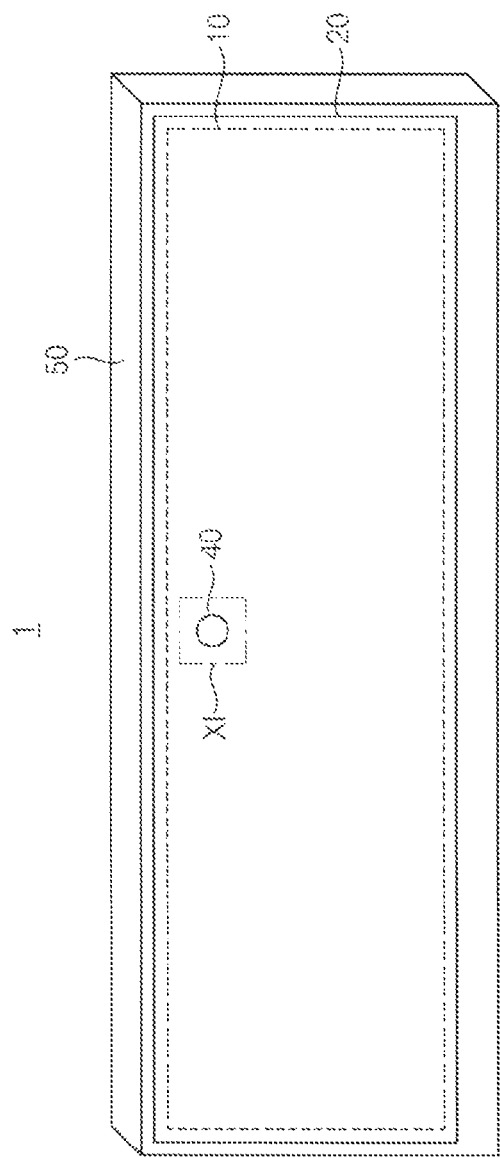
FIG. 9 is a perspective view illustrating a rear-view mirror module in accordance with example embodiments.

FIG. 9 is a perspective view illustrating a rear-view mirror module in accordance with example embodiments. FIG. 10 is a cross-sectional view illustrating the rear-view mirror module in FIG. 9.

Referring to FIGS. 9 and 10, a rear-view mirror module 1 may include a transmittance control structure 20 having a variable transmittance, a mirror type display panel 10 disposed on a rear surface of the transmittance control structure 20, an illumination sensor 30 disposed on a rear surface of the mirror type display panel 10, and a rear-view mirror housing 50 inside which the transmittance control structure 20, the mirror type display panel 10, and the illumination sensor 30 are installed. The rear-view mirror module 1 may be installed inside a vehicle and may provide information about a rear of the vehicle to a driver.

The mirror type display panel 10 may include a reflective member 140 that serves as a mirror by reflecting external light incident onto a front surface of the rear-view mirror module 1 and a display member 120 that provides information to the driver by displaying an image to the front surface of the rear-view mirror module 1. In a conventional rear-view mirror module, a display panel may be disposed on a front surface or a rear surface of a mirror, and as such, a thickness of the rear-view mirror module may be relatively thick. However, because the rear-view mirror module 1 in accordance with example embodiments of the present invention may include the mirror type display panel 10 that is combined by the mirror and the display panel, a thickness of the rear-view mirror module 1 may be relatively thin. Elements and/or constructions of the mirror type display panel 10 included in the rear-view mirror module 1 according to example embodiments, are substantially the same as or similar to that of the mirror type display panel 10 explained with reference to FIGS. 1A to 8, therefore, detailed descriptions on the repeated elements and/or constructions are omitted.

The transmittance control structure 20 may be disposed on the front surface of the mirror type display panel 10. Light transmittance of the transmittance control structure 20 may be controlled depending on an intensity of external light incident onto the front surface of the transmittance control structure 20, so that glare when driving at night may be reduced. In example embodiments, the transmittance control structure 20 may include electrochromic material. The transmittance control structure 20 may utilize an oxidation-reduction reaction of the electrochromic material to control the light transmittance. Detailed constructions of the transmittance control structure 20 may be explained with reference to FIG. 12.

The illumination sensor 30 may be disposed on the rear surface of the mirror type display panel 10. The illumination sensor 30 may sense an intensity of external light L1 incident onto the front surface of the rear-view mirror module 1. The rear-view mirror module 1 may control the light transmittance of the transmittance control structure 20 and a luminance of the mirror type display panel 10 based on the sensed intensity of the external light L1. However, the external light L1 would have to pass through the mirror type display panel 10 that is disposed in front of the illumination sensor 30, in order for the external light L1 incident onto the front surface of the rear-view mirror module 1 to transfer to the illumination sensor 30 that is disposed behind the mirror type display panel 10.

A light transmitting part 40 through which the external light L1 is passed may be formed in the rear-view mirror module 1. The light transmitting part 40 may be formed to correspond to the illumination sensor 30. For example, the light transmitting part 40 may substantially overlap the illumination sensor 30. Therefore, the illumination sensor 30 may sense the intensity of the external light L1 passing through the light transmitting part 40. The light transmitting part 40 may include the first transmittance region 122 of the display member 120 and the second transmittance region 142 of the reflective member 140. The first transmittance region 122 and the second transmittance region 142 may be formed to correspond to the illumination sensor 30.

In example embodiments, the transmittance control structure 20 may include an opening portion 202 corresponding to the illumination sensor 30. In this case, the light transmitting part 40 may include the first transmittance region 122 of the display member 120, the second transmittance region 142 of the reflective member 140, and the opening portion 202 of the transmittance control structure 20. When the opening portion 202 is formed in the transmittance control structure 20, the external light L1 may pass through the transmittance control structure 20 regardless of light transmittance of the transmittance control structure 20, so that light sensing capacity of the illumination sensor 30 may be improved.

In example embodiments, the mirror type display panel 10 may be disposed to substantially overlap the transmittance control structure 20. For example, the mirror type display panel 10 may be disposed on the rear surface of the transmittance control structure 20 to substantially overlap the transmittance control structure 20. In other words, an area of the transmittance control structure 20 and an area of the mirror type display panel 10 may be substantially the same. In a conventional rear-view mirror module, a display panel may be disposed to overlap a portion of a transmittance control structure so that external light may be transferred to an illumination sensor that is disposed on a rear surface of the transmittance control structure. Therefore, an area of the display panel may be substantially less than an area of the transmittance control structure. However, because the rear view mirror module 1 according to example embodiments of the present invention may include the light transmitting part 40 transmitting the external light L1, the mirror type display panel 10 may be disposed to overlap an entirety of the transmittance control structure 20, and therefore, the area of the mirror type display panel 10 may be increased.

In example embodiments, the light transmitting part 40 may be positioned anywhere in the rear-view mirror module 1. In other words, a position of the light transmitting part 40 in the rear-view mirror module 1 is not limited. FIG. 9 illustrates that the light transmitting part 40 is positioned on an upper part of the rear-view mirror module 1; however, the position of the light transmitting part 40 is not limited thereto. For example, the light transmitting part 40 may be positioned on a lower part, a left side, a right side, a central part, etc. In a conventional rear-view mirror module, a position of a light transmitting part may be limited so as to not overlap a display panel. However, in the rear view mirror module 1 according to example embodiments of the present invention, the light transmitting part 40 is positioned inside the mirror type display panel 10 so that the position of the light transmitting part 40 may be not limited, and the light transmitting part 40 may be freely positioned according to a displacement of the rear-view mirror module 1.

Figure 11:
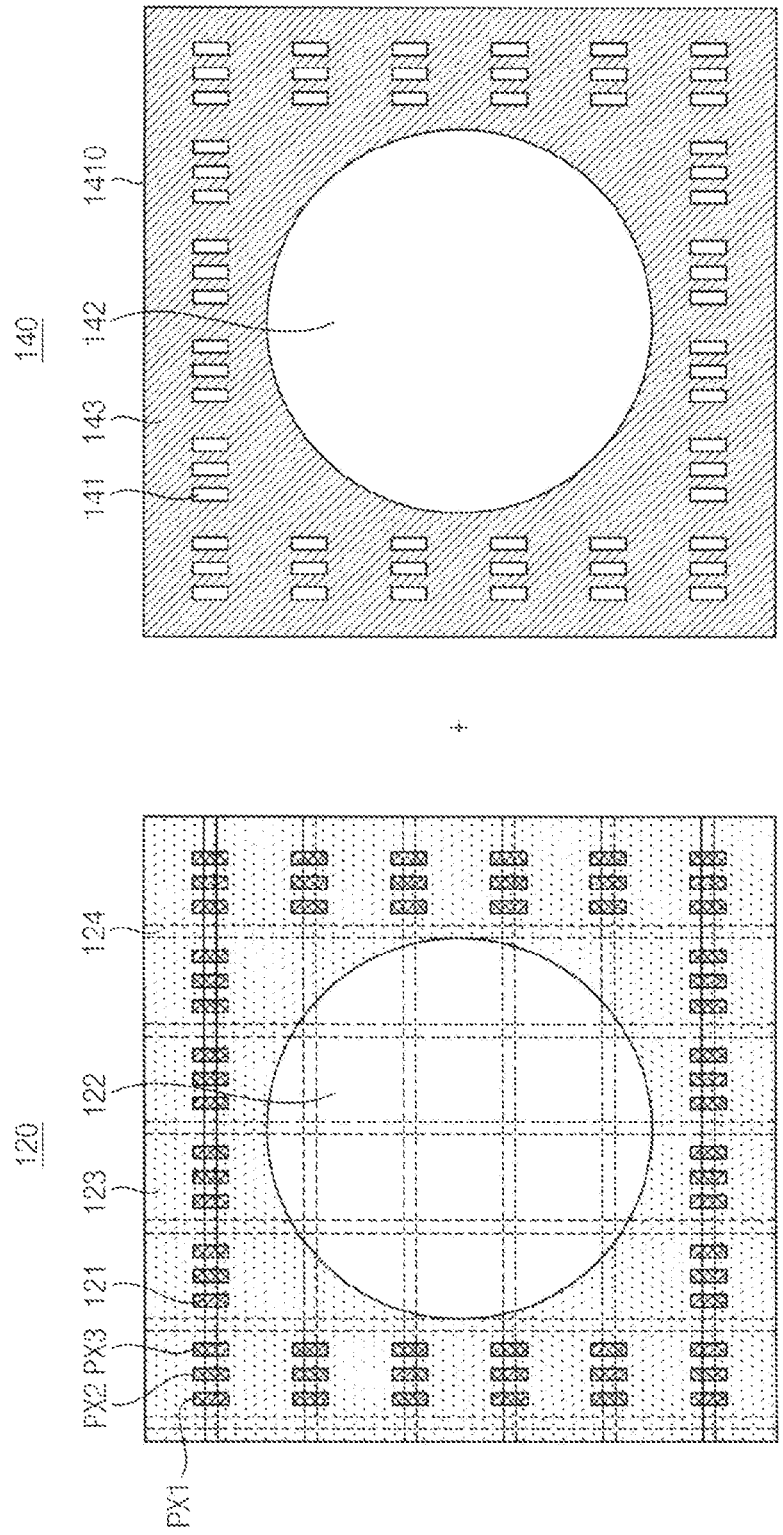
FIG. 11 is a plan view illustrating a portion of the rear-view mirror module in FIG. 9.

FIG. 11 is a plan view illustrating a portion of the rear-view mirror module in FIG. 9. For example, FIG. 11 may be a plan view illustrating an area XI of the rear-view mirror module in FIG. 9.

Referring to FIG. 11, the display member 120 may include a plurality of light emission regions 121, a first transmission region 122 spaced apart from the plurality of light emission regions 121, and a peripheral region 123 surrounding the plurality of light emission regions 121 and the first transmission region 122. The organic light emitting structure 1230 in FIG. 3 emitting light may be positioned in each of the plurality of light emission region 121. The switching structure 1210 in FIG. 3 transferring a driving current to the organic light emitting structure 1230 and wirings 124 transferring an electrical signal to the switching structure 1210 may be positioned in each of the plurality of light emission region 121 and/or the peripheral region 123. For example, the wirings 124 may be extended along a first direction and/or a second direction substantially perpendicular to the first direction. The organic light emitting structure 1230 and the switching structure 1210 may be not positioned in the first transmission region 122. Therefore, external light incident onto a front surface of the display member 120 may pass through the first transmission region 122. The first transmission region 122 may be positioned to correspond to the illumination sensor 30.

The reflective member 140 may include a plurality of opening regions 141 corresponding to the light emission regions 121, a second transmission region 142 corresponding to the first transmission region 122, and a reflective region 143 surrounding the plurality of opening regions 141 and the second transmission region 142. A reflective layer 1410 reflecting the external light may be positioned in the reflective region 143. The reflective layer 1410 may be not positioned in the second transmission region 142. Therefore, the external light incident onto a front surface of the reflective member 140 may pass through the second transmission region 142. The second transmission region 142 may be positioned to correspond to the illumination sensor 30. The first transmission region 122 and the second transmission region 142 may be positioned to correspond to the illumination sensor 30 disposed on a rear surface of the mirror type display panel 10, so that the external light incident onto the front surface of the rear-view mirror module 1 may be transferred to the illumination sensor 30 through the first transmission region 122 and the second transmission region 142.

Figure 12:
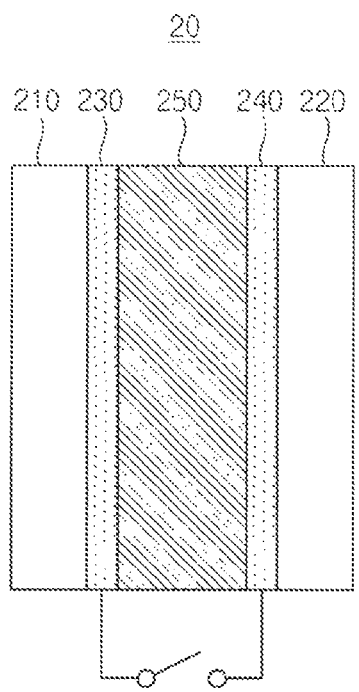
FIG. 12 is a cross-sectional view illustrating a transmittance control structure in accordance with example embodiments.

FIG. 12 is a cross-sectional view illustrating a transmittance control structure in accordance with example embodiments.

Referring to FIG. 12, the transmittance control structure 20 may include a first transparent substrate 210 and a second transparent substrate 220, which face each other with a predetermined distance in between, a first transparent electrode 230 and a second transparent electrode 240 disposed on facing surfaces of the first transparent substrate 210 and the second transparent substrate 220, respectively, and an electrochromic layer 250 interposed between the first transparent electrode 230 and the second transparent electrode 240. In example embodiments, the transmittance control structure 20 may include electrochromic material of which light characteristic may be reversibly changed according to an electrochemical oxidation reduction reaction. Therefore, the transmittance control structure 20 may become colorless when an electrical signal is not applied, and may become colored when the electrical signal is applied, so that light transmittance of the transmittance control structure 20 may be controlled.

The first transparent substrate 210 and the second transparent substrate 220 may include transparent material such as glass, silicon, synthetic resin, aerogel, etc. The first transparent electrode 230 and the second transparent electrode 240 may be disposed on the first transparent substrate 210 and the second transparent substrate 220, respectively, and may include transparent conductive material such as indium-tin oxide (ITO), indium-zinc oxide (IZO), zinc oxide (ZnO), indium-gallium oxide (IGO), etc.

The electrochromic layer 250 may include liquid or solid electrochromic material and electrolyte. The electrochromic layer 250 may be interposed between the first transparent electrode 230 and the second electrode 240, and may be colored or decolorized through an oxidation reaction or a reduction reaction by an electric field applied between the first transparent electrode 230 and the second transparent electrode 240. The electrochromic layer 250 may be formed using a vacuum bonding method, which may include injecting the electrochromic material and the electrolyte into a gap between the first transparent electrode 230 and the second transparent electrode 240. The electrochromic material may be organic electrochromic material or inorganic electrochromic material. For example, the organic electrochromic material may include viologen, anthraquinone, polyaniline or polythiophene, and the inorganic electrochromic material may include $WO_3$, $MoO_3$, $CeO_3$, $MnO_2$ or $Nb_2O_5$.

Light transmittance of the transmittance control structure 20 may be controlled by utilizing the oxidation reduction reaction of the electrochromic material and in accordance with the intensity of the external light, so that glare may be reduced while driving at night.

Figure 13:
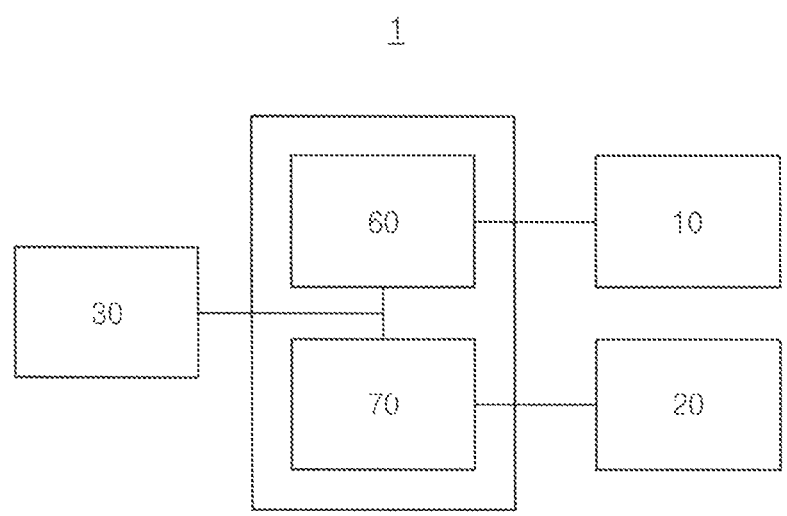
FIG. 13 is a block diagram illustrating a rear-view mirror module in accordance with example embodiments.

FIG. 13 is a block diagram illustrating a rear-view mirror module in accordance with example embodiments.

Referring to FIG. 13, the rear-view mirror module 1 may include an illumination sensor 30 that senses an intensity of external light, a mirror type display panel 10 of which luminance may be controlled depending on the intensity of the external light, a transmittance control structure 20 of which light transmittance may be controlled depending on the intensity of the external light, a luminance controller 60 controlling the luminance of the mirror type display panel 10, and a transmittance controller 70 controlling the light transmittance of the transmittance control structure 20.

In example embodiments, the luminance controller 60 may control the luminance of the mirror type display panel 10 based on the intensity of the external light incident into the illumination sensor 30. Additionally, the transmittance controller 70 may control the light transmittance of the transmittance control structure 20 based on the intensity of the external light incident into the illumination sensor 30.

Figure 14:
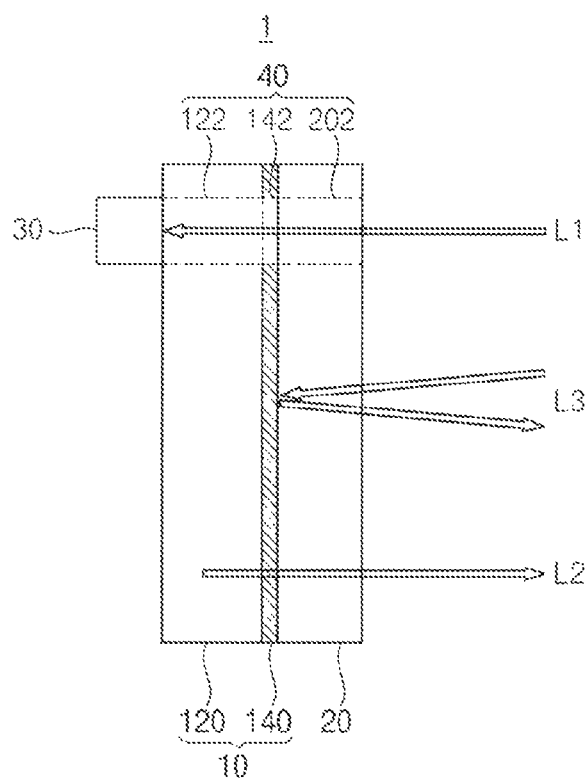
FIGS. 14 and 15 are cross-sectional views illustrating a rear-view mirror module controlling a luminance of a mirror type display panel and a transmittance of a transmittance control structure based on an intensity of external light, according to example embodiments.
Figure 15:
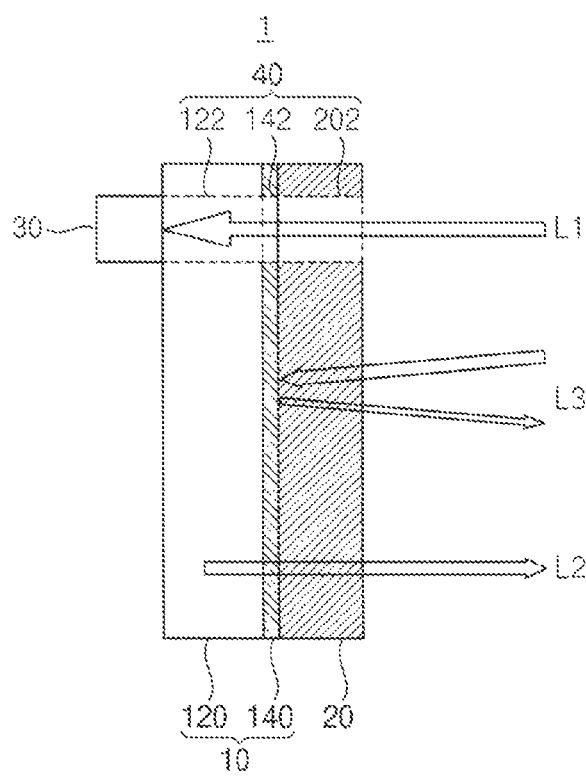

FIGS. 14 and 15 are cross-sectional views illustrating a rear-view mirror module controlling a luminance of a mirror type display panel and a transmittance of a transmittance control structure based on an intensity of external light, according to example embodiments.

Referring to FIG. 14, the luminance controller 60 may decrease the luminance of the mirror type display panel 10 and the transmittance controller 70 may increase the light transmittance of the transmittance control structure 20 when the intensity of the external light incident onto the front surface of the rear-view mirror module 1 is less than a predetermined intensity. Here, the predetermined intensity may be the lowest intensity of light that causes glare from which a driver may feel discomfort when driving at night.

When the external light L1 passing through the light transmitting part 40 is incident into the illumination sensor 30, the illumination sensor 30 may sense the intensity of the external light L1. When the intensity of the external light L1 is less than the predetermined intensity, the luminance controller 60 may decrease luminance of light L2 emitted from the display member 120 of the mirror type display panel 10, and the transmittance controller 70 may increase light transmittance of the transmittance control structure 20 so that an intensity of light L3 reflected from the reflective member 140 is not decreased. Therefore, the luminance of the light L2 emitted from the mirror type display panel 10 may decrease, thereby decreasing power consumption, when the intensity of the external light is relatively low.

Referring to FIG. 15, the luminance controller 60 may increase the luminance of the mirror type display panel 10 and the transmittance controller 70 may decrease the light transmittance of the transmittance control structure 20 when the intensity of the external light incident onto the front surface of the rear-view mirror module 1 is greater than a predetermined intensity. Here, the predetermined intensity may be the lowest intensity of light that causes glare from which a driver may feel discomfort when driving at night.

When the external light L1 passing through the light transmitting part 40 is incident into the illumination sensor 30, the illumination sensor 30 may sense the intensity of the external light L1. When the intensity of the external light L1 is greater than the predetermined intensity, the luminance controller 60 may increase luminance of light L2 emitted from the display member 120 of the mirror type display panel 10, and the transmittance controller 70 may decrease light transmittance of the transmittance control structure 20 so that an intensity of light L3 reflected from the reflective member 140 is decreased. Therefore, the intensity of the light L3 reflected from the mirror type display panel 10 may decrease, thereby decreasing intensity of glare, and the luminance of the light L2 emitted from the mirror type display panel 10 may increase, thereby increasing visibility of an image and compensating the decreased light transmittance the transmittance control structure 20, when the intensity of the external light is relatively high.

The rear-view mirror modules according to example embodiments may be applied to means of transportation such as vehicles, etc.

Although a few example embodiments have been described, those skilled in the art would readily appreciate that many modifications are possible in the example embodiments without materially departing from the novel teachings and advantages of the present inventive concept.

What is claimed is:

1. A display device, comprising:
   a display panel including a plurality of light emission regions and a transmission region surrounded by the light emission regions in a plan view; and
   a sensor disposed on a rear surface of the display panel, the sensor overlapping the transmission region in the plan view,
   wherein the display panel comprises:
   a substrate;
   a plurality of first electrodes disposed on the substrate;
   a pixel defining layer partially covering the first electrodes and defining the light emission regions;
   a second electrode facing the first electrodes;
   an organic light emitting layer disposed between one of the first electrodes and the second electrode; and
   a reflective layer disposed on the second electrode, the reflective layer including an opening which overlaps the transmission region and the sensor in the plan view.

2. The display device of claim 1, further comprising:
   a wiring disposed on the substrate, at least a portion of the wiring being disposed in the transmission region; and
   a switching structure electrically connected to at least one of the first electrodes and the wiring.

3. The display device of claim 2, wherein the switching structure is disposed between the substrate and the at least one of the first electrodes.

4. The display device of claim 2, wherein the wiring transmits an electrical signal to the switching structure.

5. The display device of claim 2, wherein the wiring extends along a first direction and/or a second direction perpendicular to the first direction in the plan view.

6. The display device of claim 1, further comprising:
   a plurality of inorganic insulation layers disposed between the substrate and the pixel defining layer, at least one of the inorganic insulation layers not being formed in the transmission region.

7. The display device of claim 6, wherein the inorganic insulation layers are not formed in the transmission region.

8. The display device of claim 6, further comprising:
   an organic insulation layer disposed between the inorganic insulation layers and the pixel defining layer, the organic insulation layer not being formed in the transmission region.

9. The display device of claim 1, wherein the pixel defining layer is not formed in the transmission region.

10. The display device of claim 1, wherein the second electrode is not formed in the transmission region.

* * * * *